(12) United States Patent
Aoshima

(10) Patent No.: US 10,205,271 B1
(45) Date of Patent: Feb. 12, 2019

(54) CONNECTOR

(71) Applicant: Yazaki Corporation, Tokyo (JP)

(72) Inventor: Kengo Aoshima, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/044,284

(22) Filed: Jul. 24, 2018

(30) Foreign Application Priority Data

Jul. 28, 2017 (JP) ................................ 2017-147010

(51) Int. Cl.
| | |
|---|---|
| *H01R 13/627* | (2006.01) |
| *H01R 13/533* | (2006.01) |
| *H01R 13/6581* | (2011.01) |
| *H01R 13/11* | (2006.01) |
| *H01R 13/502* | (2006.01) |
| *H05K 7/20* | (2006.01) |

(52) U.S. Cl.
CPC ............ *H01R 13/533* (2013.01); *H01R 13/11* (2013.01); *H01R 13/502* (2013.01); *H01R 13/6581* (2013.01); *H05K 7/2039* (2013.01)

(58) Field of Classification Search
CPC .......... H01R 13/62938; H01R 13/6275; H01R 23/7068; H01R 13/62933; H01R 13/641

USPC ...................... 439/157, 357, 924.1, 372, 489
See application file for complete search history.

(56) References Cited

U.S. PATENT DOCUMENTS

| | | | | |
|---|---|---|---|---|
| 5,144,189 A * | 9/1992 | Van Heeswijk | ........ | F21V 25/04 313/51 |
| 7,217,150 B2 * | 5/2007 | Lekic | .................. | H01R 13/6273 439/352 |
| 7,934,939 B2 * | 5/2011 | Chen | ..................... | H01R 13/639 439/352 |
| 8,083,533 B2 * | 12/2011 | De Chazal | ............. | H01R 13/53 200/51.09 |
| 8,911,245 B2 * | 12/2014 | Okamoto | ......... | H01R 13/62944 439/157 |
| 9,101,337 B2 * | 8/2015 | Hoegerle | ........... | A61B 17/1622 |

FOREIGN PATENT DOCUMENTS

JP  2016-072009 A  5/2016

* cited by examiner

*Primary Examiner* — Phuong Chi T Nguyen
(74) *Attorney, Agent, or Firm* — Kenealy Vaidya LLP

(57) ABSTRACT

Provided are: a male terminal which has an outer peripheral wall side of a tubular terminal connection portion as a contact point with a mating terminal; an insulating insulation member which is configured to achieve electrical insulation of a distal end of the terminal connection portion on a side of a mating connector; and an insulating housing which accommodates the male terminal and the insulation member.

9 Claims, 9 Drawing Sheets

CONNECTOR

CROSS-REFERENCE TO RELATED APPLICATION(S)

The present application claims priority to and incorporates by reference the entire contents of Japanese Patent Application No. 2017-147010 filed in Japan on Jul. 28, 2017.

BACKGROUND OF THE INVENTION

1. Field of the Invention

The present invention relates to a connector.

2. Description of the Related Art

Conventionally, a female connector and a male connector which electrically connect male and female terminals, separately provided, to each other have been known as connectors. For example, the female connector includes a female terminal having a tubular terminal connection portion, and a housing accommodating the female terminal. On the other hand, the male connector includes a male terminal having a shaft-shaped terminal connection portion, and a housing accommodating the male terminal. As the housings of the female connector and the male connector are inserted and fitted to each other, the terminal connection portion of the male terminal is inserted and fitted to a space inside the terminal connection portion of the female terminal. A connector of this type is disclosed, for example, in Japanese Patent Application Laid-open No. 2016-72009 below. Here, in the connectors which have been fitted to each other, the female terminal and the male terminal generate heat as a current flows thereto, and temperatures of components including the female terminal and the male terminal rise. In particular, each amount of heat generation of the female terminal and the male terminal increases when a large current flows, and thus, there is a possibility that cost for the temperature rise of the components becomes great. For example, in the connector of Japanese Patent Application Laid-open No. 2016-72009, a male terminal is screwed to a nut, fixed to a fixing portion of a housing, and heat of the male terminal is released to the fixing portion via the nut as a heat transfer component.

Meanwhile, the conventional connector is provided with the heat transfer component in order to release the heat of the male terminal as described above. That is, the number of components is increased in order to release the heat of the male terminal in the conventional connector. The conventional connector has room for improvement in this point of view.

SUMMARY OF THE INVENTION

Therefore, an object of the present invention is to provide a connector capable of suppressing a temperature rise while suppressing an increase in the number of components.

A connector according to one aspect of the present invention includes a male terminal which has an outer peripheral wall side of a tubular terminal connection portion as a contact point with a mating terminal; an insulating insulation member that achieves electrical insulation of a distal end of the terminal connection portion on a side of a mating connector; and an insulating housing which accommodates the male terminal and the insulation member, wherein the insulation member includes: a distal end insulation portion provided at the distal end of the terminal connection portion; a shaft portion extending from the distal end insulation portion along a space inside the terminal connection portion, and at least one heat dissipating portion which is a portion protruding from the shaft portion toward an outside of the terminal connection portion in a direction intersecting a cylinder axis of the terminal connection portion, and is capable of dissipating heat at the outside of the terminal connection portion.

According to another aspect of the present invention, in the connector, it is preferable that the housing has a fixing portion which is attached to a connector installation target, and the heat dissipating portion is brought into contact with the connector installation target when the housing is attached to the connector installation target.

According to still another aspect of the present invention, in the connector, it is preferable that the heat dissipating portion is sandwiched between the housing and the connector installation target when the housing is attached to the connector installation target.

According to still another aspect of the present invention, in the connector, it is preferable that the heat dissipating portion is brought into contact with a portion of the connector installation target having a higher thermal conductivity than that of the insulation member.

According to still another aspect of the present invention, it is preferable that the connector further includes a shield member which has both an electrical conductivity and a high thermal conductivity, electrically shields an inside of the housing, and is brought into contact with the connector installation target, wherein the heat dissipating portion is brought into contact with the shield member.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, embodiments of a connector according to the present invention will be described in detail with reference to the drawings. Incidentally, the invention is not limited by the embodiments.

Embodiment

One of embodiments of the connector according to the present invention will be described with reference to FIGS. 1 to 10.

Figure 1:
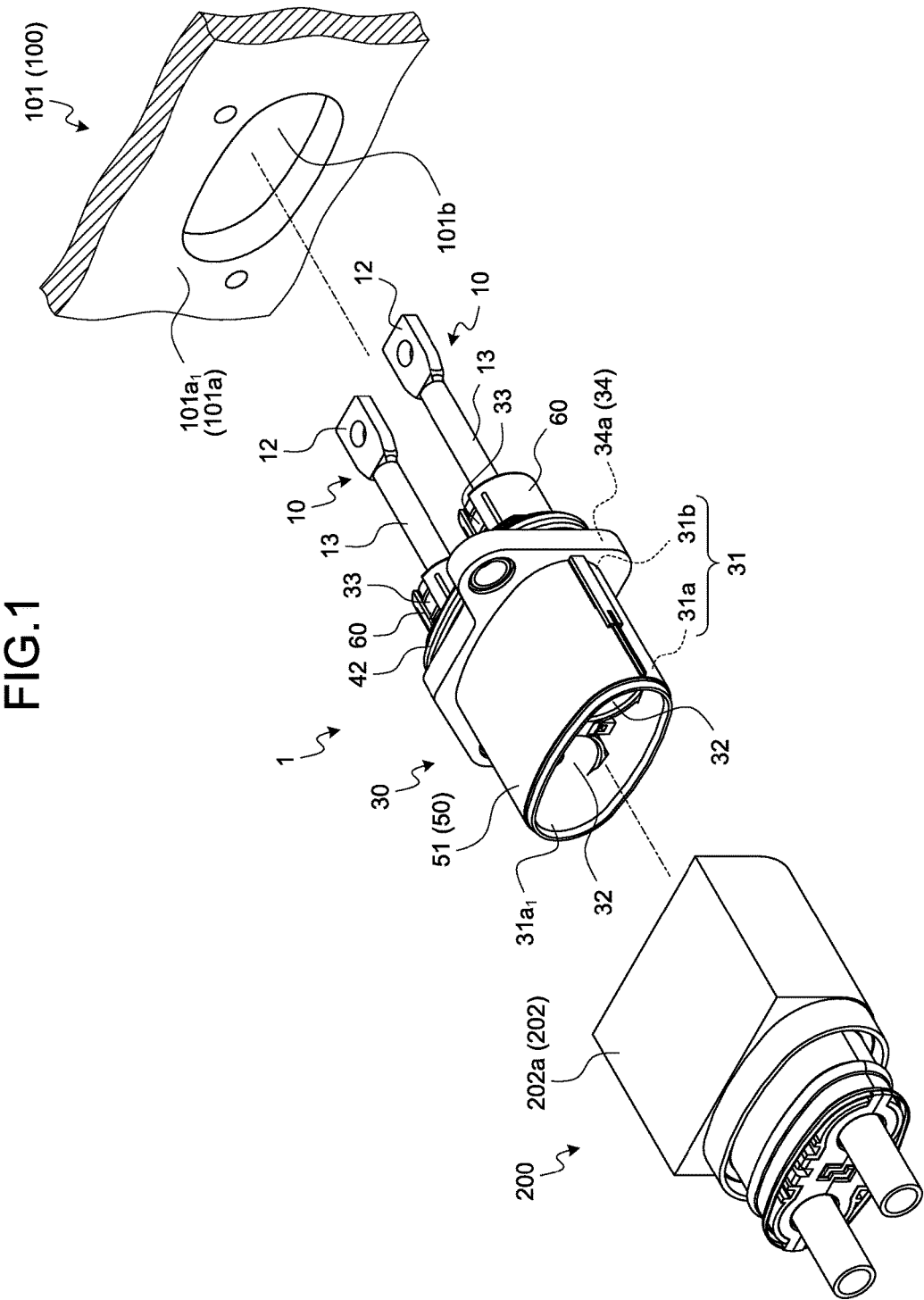
FIG. 1 is a perspective view illustrating a connector of an embodiment together with a mating connector.
Figure 2:
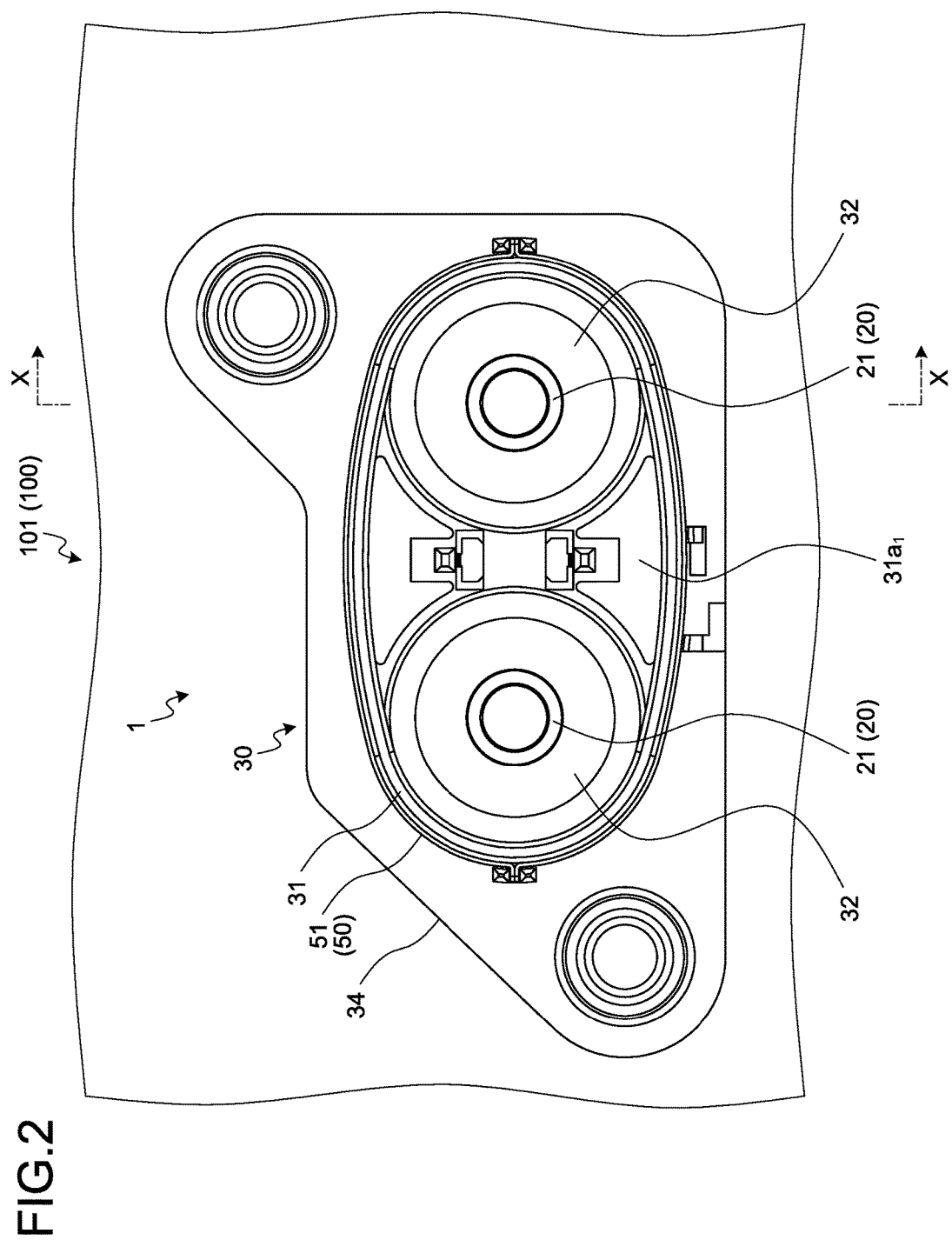
FIG. 2 is a front view illustrating the connector of the embodiment.
Figure 3:
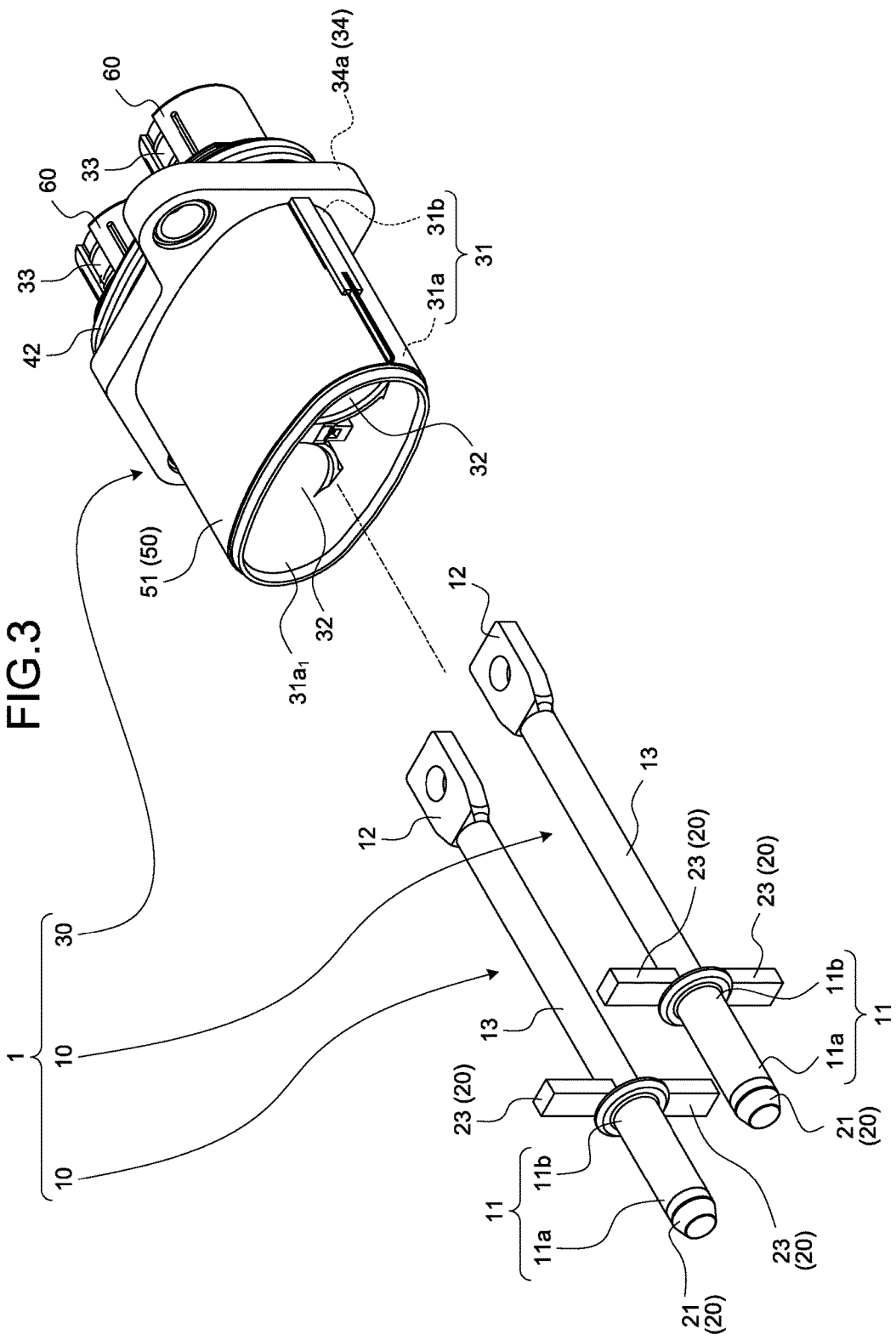
FIG. 3 is a partially exploded perspective view of the connector of the embodiment.
Figure 4:
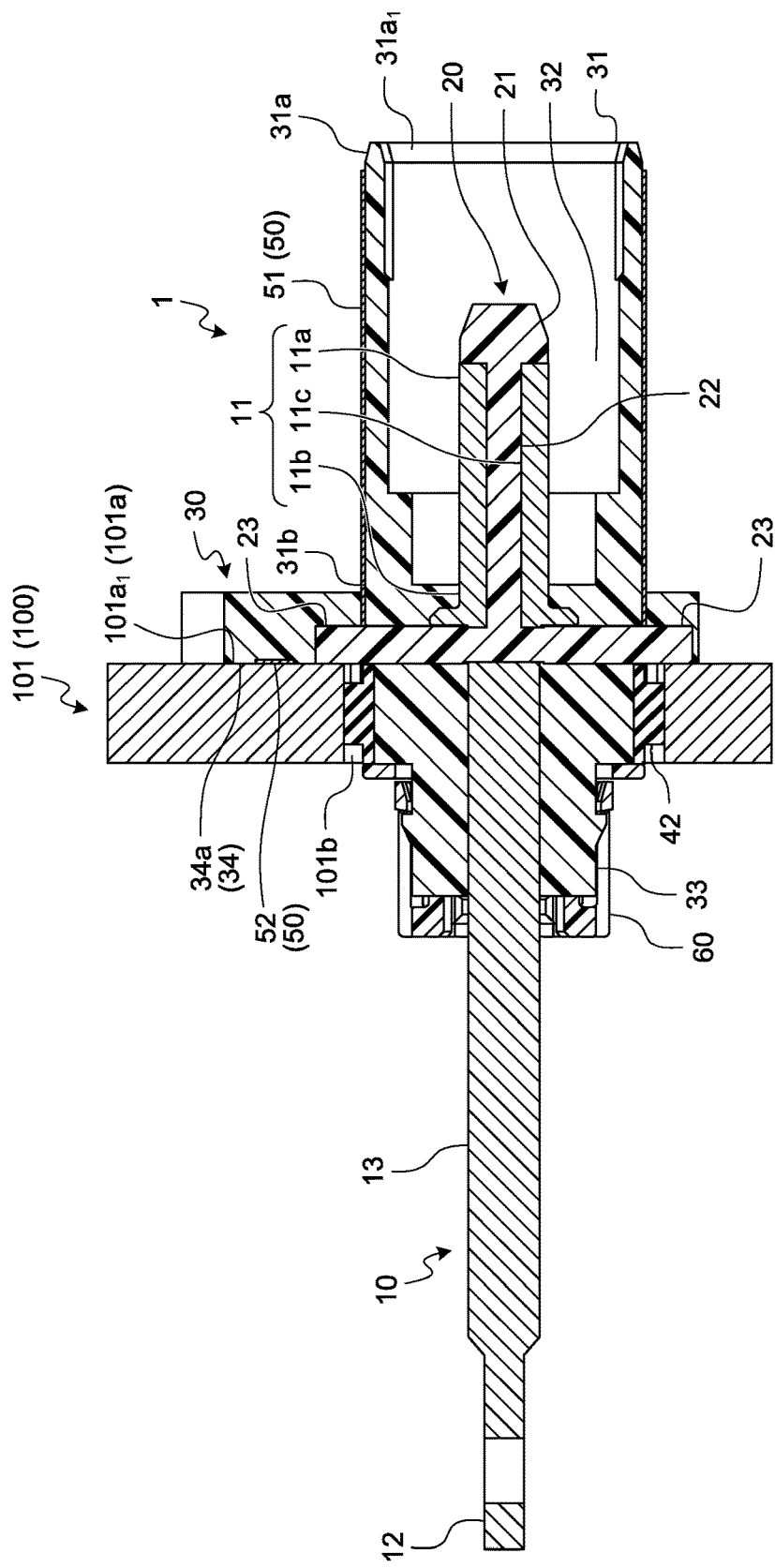
FIG. 4 is a cross-sectional view taken along a line X-X of FIG. 2.

Reference numeral 1 in FIGS. 1 to 4 represents a connector according to the present embodiment. The connector 1 is attached to an object to be installed (hereinafter referred to as a "connector installation target") 100 (FIGS. 1, 2 and 4). Incidentally, a housing 30 is integrated with a male terminal 10 by insert-molding in the connector 1 as will be described later. Therefore, FIG. 3 illustrates the housing 30 which has been taken out from the male terminal 10 after the insert-molding for convenience of description.

The connector installation target 100 is an object to be electrically connected to a mating connector 200 (FIGS. 1, 5 and 6) and examples thereof includes drive devices of a vehicle (an electric motor, an inverter, and the like of an electric car or a hybrid vehicle), electrical equipment (such as an actuator) serving as a load, and the like. The connector installation target 100 includes a main body (not illustrated) to be electrically connected and a holding member 101 (FIGS. 1, 2, and 4) that holds the main body. The holding member 101 indicates, for example, a casing such as an accommodating member that accommodates the main body, a frame that holds and supports the main body, and the like. The mating connector 200 indicates a connector that is physically and electrically connected to the connector 1 of the present embodiment. The mating connector 200 is electrically connected to the main body of the connector installation target 100 via the connector 1 of the present embodiment.

The connector 1 is a so-called male connector and includes a male-type terminal (hereinafter referred to as a "male terminal") 10 (FIGS. 1, 3, 4 and 7 to 9). As the connector 1 is inserted and fitted to the mating connector 200 which is a female connector, the male terminal 10 is physically and electrically connected to a female terminal 201 (FIGS. 5 and 6) which is a mating terminal.

The male terminal 10 is molded into the mail type using a conductive material such as metal. Here, a male terminal fitting molded using a metal material such as copper, a copper alloy, aluminum, and an aluminum alloy is illustrated as an example of the male terminal 10. The male terminal 10 includes a terminal connection portion 11, an electrical connection portion 12, and a coupling portion 13 (FIGS. 3, 4, and 7 to 9).

The terminal connection portion 11 is a portion to be physically and electrically connected to the female terminal 201. The terminal connection portion 11 is formed in a tubular shape, and an outer peripheral wall side thereof is used as a contact point with a terminal connection portion 201a (FIGS. 5 and 6) of the female terminal 201. The terminal connection portion 201a of the female terminal 201 is formed into a tubular shape so that the terminal connection portion 11 of the male terminal 10 can be inserted into an internal space thereof. Here, each of the terminal connection portions 11 and 201a is formed into the straight cylindrical shape. The terminal connection portion 11 of the male terminal 10 is fitted to the terminal connection portion 201a and is physically and electrically connected to the terminal connection portion 201a by being inserted into the space at the inner side of the terminal connection portion 201a of the female terminal 201. In the terminal connection portion 11 of the male terminal 10, an end on a side of the mating connector 200 (that is, an inserting direction side toward the terminal connection portion 201a of the female terminal 201) is set as a distal end 11a, and an end on the opposite side of the end (distal end 11a) is set as a rear end 11b (FIGS. 3, 4, and 7 to 9).

The electrical connection portion 12 is a portion to be electrically connected to the main body of the connector installation target 100. When the connector 1 is attached to the connector installation target 100, the electrical connection portion 12 is arranged in an internal space of the holding member 101 as the casing, and is electrically connected to the main body in the internal space. The electrical connection portion 12 in this example is formed into a shape such as a so-called rectangular terminal that is physically and electrically connected to a counterpart by screwing.

The coupling portion 13 is a portion connecting the terminal connection portion 11 and the electrical connection portion 12. The coupling portion 13 is formed in a shaft shape. The coupling portion 13 has one end coupled with the terminal connection portion 11 and the other end coupled with the electrical connection portion 12. The coupling portion 13 in this example is formed in a straight columnar shape and is arranged coaxially with a cylinder axis of the terminal connection portion 11. The rear end 11b of the terminal connection portion 11 is connected to the coupling portion 13.

The two male terminals 10 are arranged side by side in the connector 1 (FIG. 3).

Figure 10:
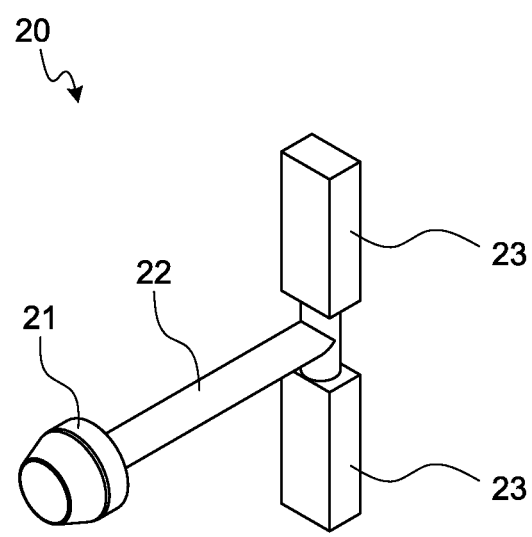
FIG. 10 is a perspective view illustrating the insulation member.

The connector 1 further includes an insulating insulation member 20 configured to achieve electrical insulation of the distal end 11a of the terminal connection portion 11 (FIGS. 2 to 4, 7, and 10). The insulation member 20 is molded using an insulating material such as synthetic resin. This insulation member 20 is provided for each of the male terminals 10. Incidentally, the insulation member 20 is integrated with the male terminal 10 by insert-molding as will be described later. Therefore, FIG. 10 illustrates the insulation member 20 which has been taken out from the male terminal 10 after the insert-molding for convenience of description.

The insulation member 20 is used not only for the electrical insulation of the distal end 11a of the terminal connection portion 11 but also for heat dissipation of the male terminal 10 as will be described later. Accordingly, it is desirable to use a material having a high thermal conductivity among the insulating materials for the insulation member 20. In addition, it is desirable to mold the insulation member 20 using a material having a higher thermal conductivity than that of the housing 30 to be described later. For example, here, PPS (Poly Phenylene Sulfide) is used for the insulation member 20 and PBT (Polybutylene Terephthalate) is used for the housing 30.

The insulation member 20 has a distal end insulation portion 21 provided at the distal end 11a of the terminal connection portion 11 (FIGS. 2 to 4, 7, and 10). The distal end insulation portion 21 is a portion configured to achieve the electrical insulation of the distal end 11a of the terminal connection portion 11. The distal end insulation portion 21 is formed in a columnar shape and is arranged in the state of protruding from the distal end 11a on an end surface of the distal end 11a of the terminal connection portion 11. Here, the distal end insulation portion 21 is formed so as to have a columnar shape having a circular cross section orthogonal to the axial direction in accordance with the cylindrical terminal connection portion 11.

This insulation member 20 achieves electrical insulation of the distal end 11a of the terminal connection portion 11 at the distal end insulation portion 21, and has not only such a function for electrical insulation but also a function for releasing heat generated by energization between the male terminal 10 and the female terminal 201.

When the terminal connection portion 11 generates heat accompanying energization, the male terminal 10 transmits the heat to the coupling portion 13 and further transmits the heat from the coupling portion 13 to the electrical connection portion 12. As will be described later, a side of the coupling portion 13 facing the electrical connection portion 12 and the electrical connection portion 12 are arranged outside the housing 30 in the male terminal 10. Accordingly, the heat generated in the terminal connection portion 11 is dissipated to the atmosphere of the internal space of the holding member 101 serving as the casing, for example, via the coupling portion 13 and the electrical connection portion 12. However, the amount of heat generation at the terminal connection portion 11 increases when a large current flows, and thus, it is necessary to dissipate more heat.

Therefore, the connector 1 is configured such that the heat generated in the terminal connection portion 11 is dissipated via the insulation member 20. The male terminal 10 has a shaft portion 22 which serves as a heat receiving portion of the heat generated in the terminal connection portion 11 and a heat dissipating portion 23 which dissipates the heat (FIGS. 4, 7, and 10).

Figure 7:
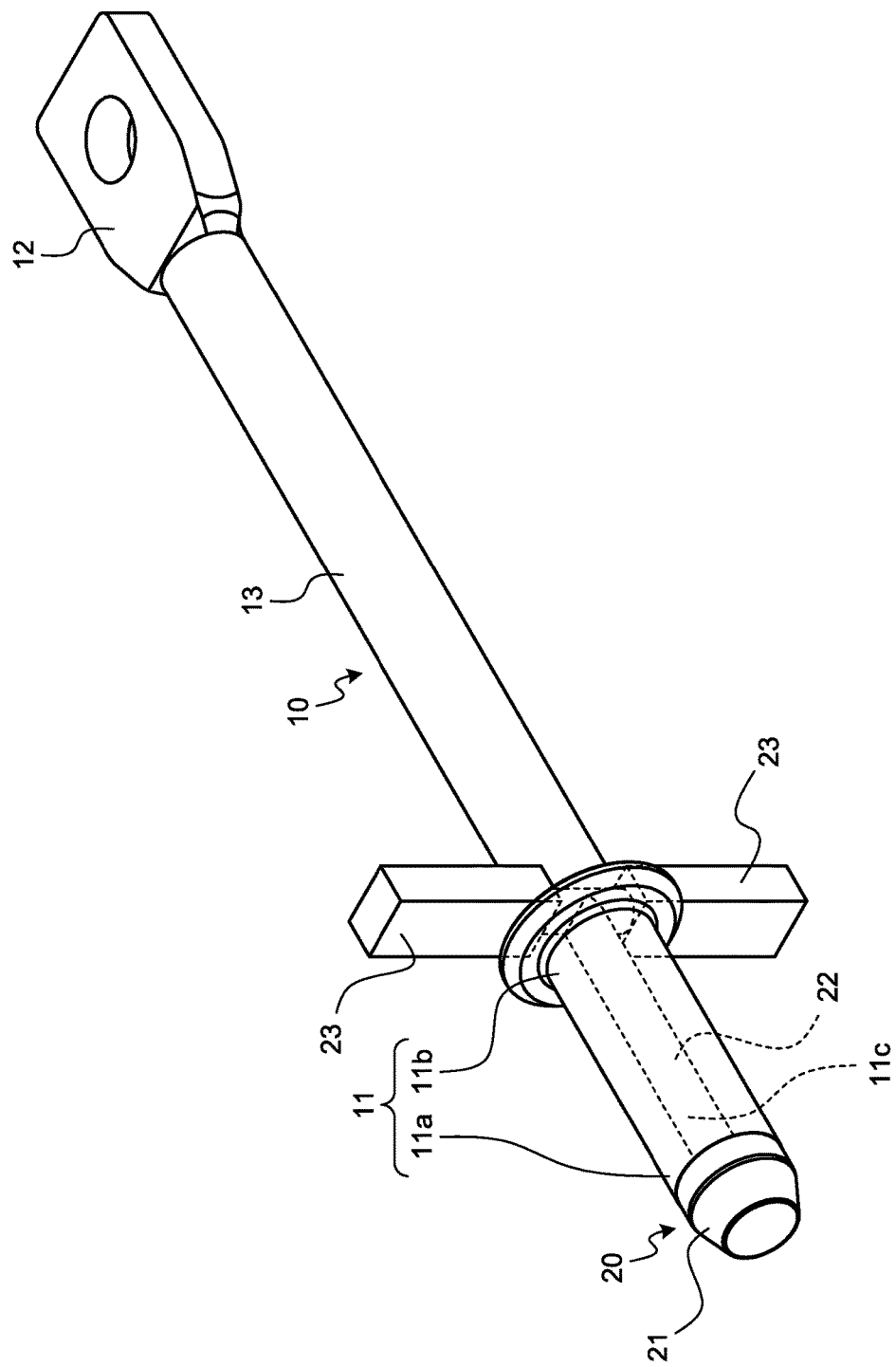
FIG. 7 is a perspective view illustrating a product obtained by integrating a male terminal and an insulation member.
Figure 8:
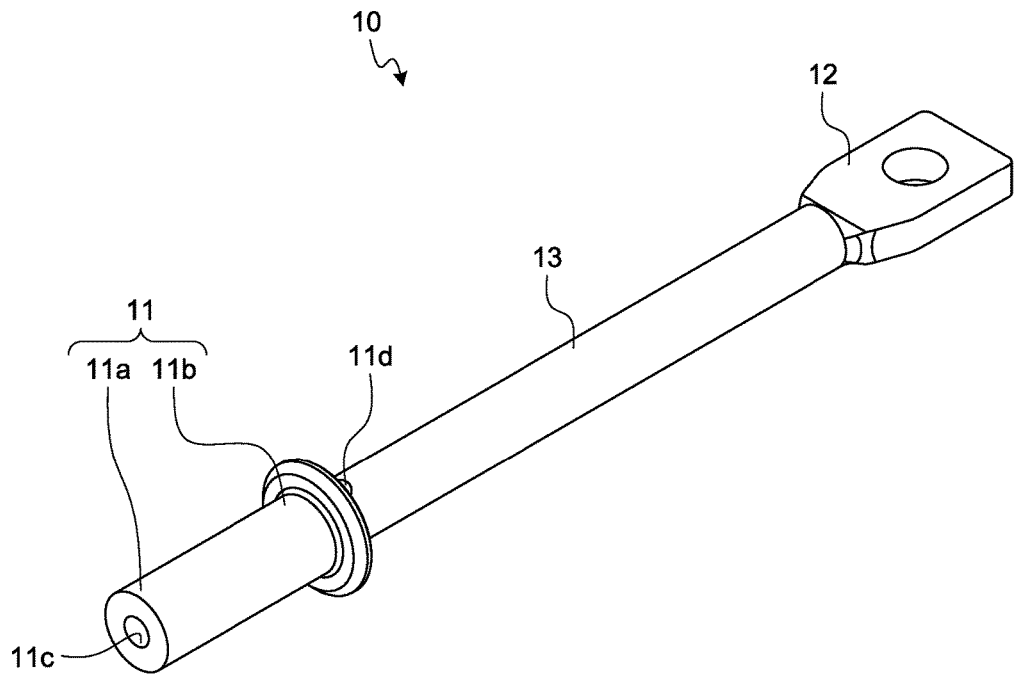
FIG. 8 is a perspective view illustrating the male terminal.

The shaft portion 22 is a portion which extends from the distal end insulation portion 21 along a space 11c inside the terminal connection portion 11 (FIGS. 4, 7, and 8). The shaft portion 22 is formed so as to be in close contact with an inner peripheral wall of the space 11c, and receives the heat of the terminal connection portion 11 from the inner peripheral wall. Here, the shaft portion 22 is formed in a columnar shape in accordance with the cylindrical terminal connection portion 11. The shaft portion 22 extends from the distal end 11a to the rear end 11b of the terminal connection portion 11.

Figure 9:
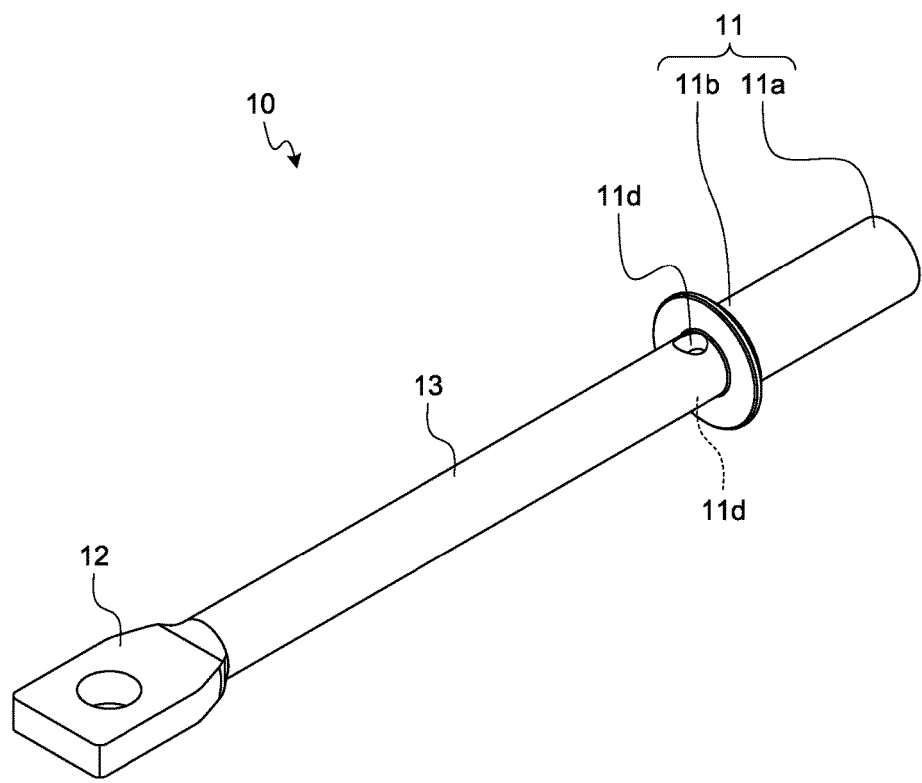
FIG. 9 is a perspective view of the male terminal as viewed from another angle.

The heat dissipating portion 23 is a portion which protrudes from the shaft portion 22 toward the outside of the terminal connection portion 11 in a direction intersecting a cylinder axis of the terminal connection portion 11. That is, the heat dissipating portion 23 can receive the heat that has transmitted through the shaft portion 22 and dissipate the heat outside the terminal connection portion 11. The terminal connection portion 11 has a through hole 11d for communicating the inner space 11c with the outside (FIGS. 8 and 9). The heat dissipating portion 23 is connected between the space 11c inside the terminal connection portion 11 and the outside through the through hole 11d.

At least one heat dissipating portion 23 is provided. For example, the heat dissipating portion 23 is formed to protrude from the shaft portion 22 in a shaft shape. Here, the two shaft-shaped heat dissipating portions 23, which protrude in a direction orthogonal to the cylinder axis of the terminal connection portion 11, are provided (FIGS. 3, 4, 7, and 10). The respective heat dissipating portions 23 protrude in directions opposite to each other at the rear end 11b of the terminal connection portion 11.

The connector 1 further includes the insulating housing 30 which accommodates the male terminal 10 and the insulation member 20 (FIGS. 1 to 4). The housing 30 is molded using an insulating material such as synthetic resin. As described above, the housing 30 is molded using PBT in this example.

Figure 5:
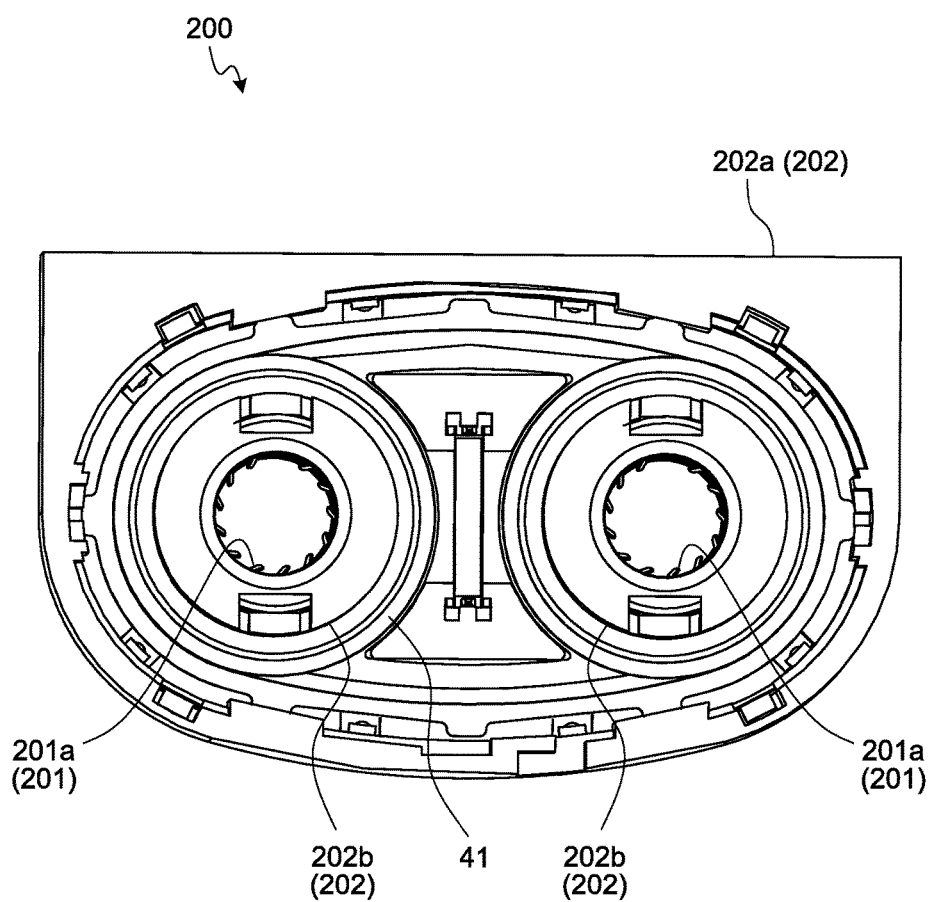
FIG. 5 is a front view illustrating the mating connector.
Figure 6:
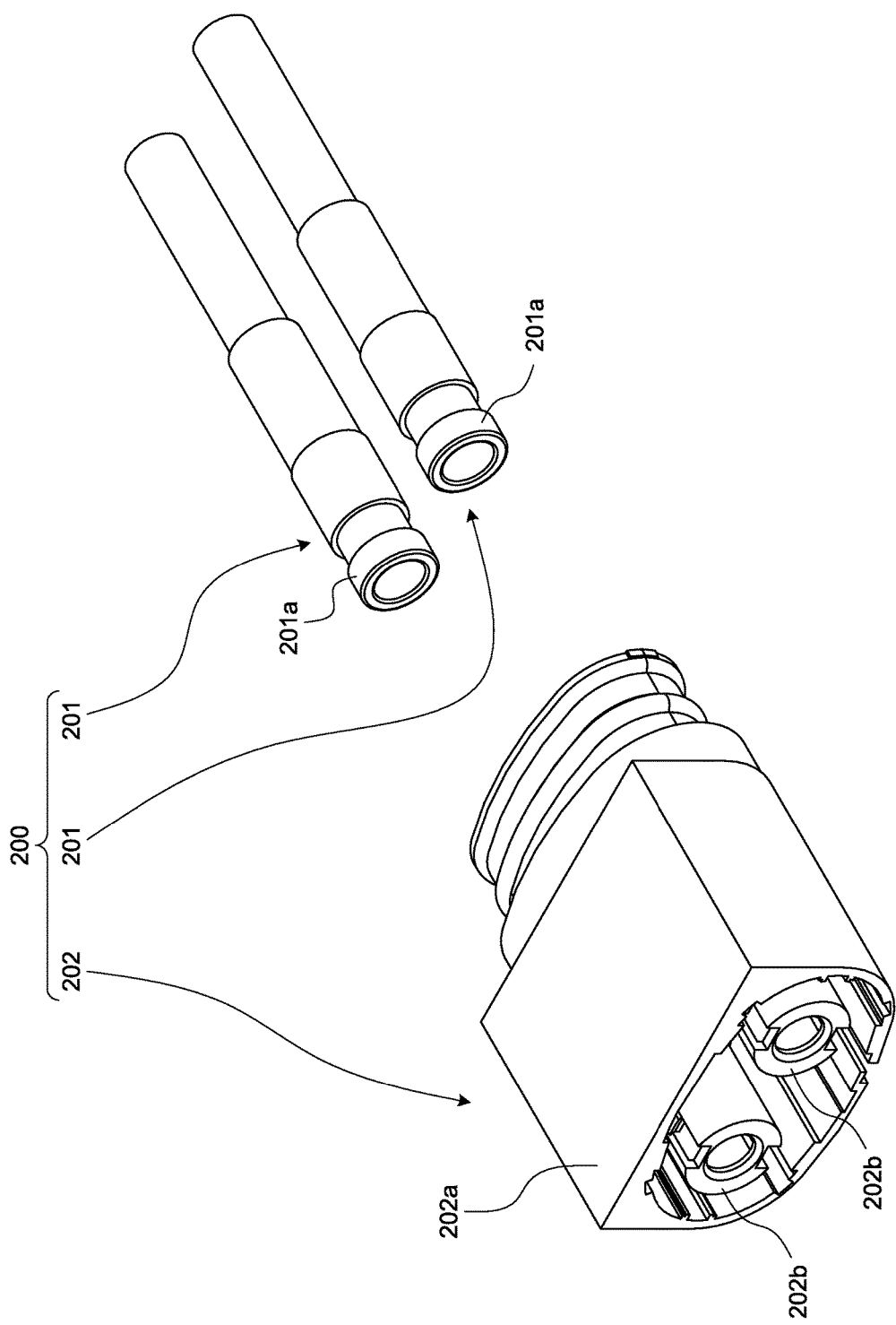
FIG. 6 is a partially exploded perspective view of the mating connector.

The housing 30 has a fitting portion 31 (FIGS. 1 to 4). The fitting portion 31 is inserted and fitted to a fitting portion 202a (FIGS. 1, 5, and 6) of a mating housing 202. The fitting portion 31 is formed in a tubular shape having an elliptical cross section. The fitting portion 202a is formed in a tubular shape so as to serve as an inner space of the elliptical cross section into which the fitting portion 31 can be inserted. A seal member 41, configured to improve liquid tightness, is provided between the respective fitting portions 31 and 202a (FIG. 5).

Two sets of a combination of the male terminal 10 and the insulation member 20 are accommodated in a space inside the fitting portion 31. The fitting portion 31 has two columnar spaces along a cylinder axis direction at an inside thereof, and the respective spaces are used as male terminal accommodating chambers 32 (FIGS. 1 to 4). Each one set of the combination of the male terminal 10 and the insulation member 20 is accommodated in each of the male terminal accommodating chambers 32. The terminal connection portion 11 of the male terminal 10 and the distal end insulation portion 21 and the shaft portion 22 of the insulation member 20 are accommodated in the male terminal accommodating chamber 32 in this example.

The male terminal accommodating chamber 32 becomes a cylindrical space in the state where the male terminal 10 and the insulation member 20 are accommodated. When the connector 1 and the mating connector 200 are inserted and fitted to each other, a female terminal accommodating portion 202b (FIGS. 5 and 6) of the mating housing 202 is inserted into this cylindrical male terminal accommodating chamber 32 through an opening $31a_1$ (FIGS. 1 to 4) at one end 31a of the fitting portion 31. The female terminal accommodating portion 202b is formed in a cylindrical shape and accommodates the female terminal 201 in a space inside thereof. Accordingly, the terminal connection portion 11 of the male terminal 10 is inserted and fitted to the terminal connection portion 201a of the female terminal 201 as the female terminal accommodating portion 202b is inserted into the cylindrical male terminal accommodating chamber 32.

In this manner, the male terminal 10 is accommodated inside the fitting portion 31 in the housing 30. Therefore, the connector 1 has a shield member 50 which electrically shields the inside of the fitting portion 31 of the housing 30 (FIGS. 1 to 4). The shield member 50 is molded into a tubular shape having an elliptical cross section using a conductive material, and is provided on the fitting portion 31 while aligning cylinder axes thereof. Here, the shield member 50 is molded using a member (a metal material or the like) having both an electrical conductivity and a high thermal conductivity. The shield member 50 in this example has a tubular shield main body 51 that covers an outer peripheral wall of the fitting portion 31 from the outside (FIGS. 1 to 4). In addition, the shield member 50 in this example is fastened to a fixed portion 101a (FIG. 1) of the holding member 101 together with a fixing portion 34 (FIGS. 1 to 4) of the housing 30 by a screw member (not illustrated) as will be described later. Accordingly, here, the shield member 50 has a fixing portion 52 which is fixed to the fixed portion 101a at the time of fastening together (FIG. 4). The fixing portion 52 is fixed in the state of being in contact with the fixed portion 101a. That is, at least a part of the shield member 50 in this example including the fixing portion 52 is brought into contact with the holding member 101.

The housing 30 has a cylindrical holding portion 33 at an end (the other end 31b) of the fitting portion 31 on a side opposite to the opening $31a_1$ (FIGS. 1, 3, and 4). The holding portion 33 is arranged coaxially with the male terminal accommodating chamber 32, and holds the coupling portion 13 of the male terminal 10 in a space inside thereof. The holding portion 33 is provided for each of the male terminals 10. A cylindrical rear holder 60 is fitted to the holding portion 33 (FIGS. 1, 3, and 4). The coupling portion 13 protrudes from the rear holder 60.

The housing 30 has the fixing portion 34 which is attached to the connector installation target 100 (FIGS. 1 to 4). The fixing portion 34 is a portion formed in a flange shape at the other end 31b of the fitting portion 31. The fixing portion 34 is fixed to the fixed portion 101a (FIG. 1) of the connector installation target 100 by screwing using a screw member (not illustrated). The fixed portion 101a is a part of the holding member 101. The holding member 101 has a through hole 101b (FIGS. 1 and 4) through which the other end 31b of the fitting portion 31 is inserted, and a predetermined region including a peripheral edge of the through hole 101b is used as the fixed portion 101a. An annular seal member 42 (FIGS. 1, 3 and 4) configured to improve liquid tightness is provided between the other end 31b and the through hole 101b. In the state where the other end 31b is inserted through the through hole 101b, flat surfaces 34a and $101a_1$ of the fixing portion 34 and the fixed portion 101a are brought into close contact with each other (FIG. 4). In this connector 1, the fixing portion 52 of the shield member 50 is fastened in the state of being in contact with the fixed portion 101a when screwing the fixing portion 34 and the fixed portion 101a.

The heat dissipating portion 23 described above is brought into contact with the connector installation target 100 when the housing 30 is attached to the connector installation target 100. The heat dissipating portion 23 is desirably sandwiched between the housing 30 and the connector installation target 100 in order to maintain the contact state with the connector installation target 100. The heat dissipating portion 23 transmits the heat received from the shaft portion 22 to the connector installation target 100 by being brought into contact with the connector installation target 100. Therefore, the heat dissipating portion 23 is desirably brought into contact with a portion having a higher thermal conductivity than the insulation member 20 in the connector installation target 100. In this example, the holding member 101 of the connector installation target 100 is molded using aluminum having a higher thermal conductivity than the insulation member 20. Thus, the heat dissipating portion 23 is brought into contact with the holding member 101.

The heat dissipating portion 23 in this example is brought into contact with the fixed portion 101a of the holding member 101. In this example, the heat dissipating portion 23 is formed so as to be flush with the flat surface 34a of the fixing portion 34, and the heat dissipating portion 23 is brought into close contact with the fixed portion 101a when the fixing portion 34 and the fixed portion 101a are fixed. That is, here, the heat dissipating portion 23 is sandwiched between the fixing portion 34 and the fixed portion 101a.

In the connector 1 configured in this manner, the male terminal 10 and the shield member 50 is separately molded. Further, in the connector 1, the insulation member 20 is insert-molded in a die in which the male terminal 10 is arranged. Thereafter, in the connector 1, the housing 30 is insert-molded in a die in which the integrated body of the male terminal 10 and the insulation member 20 and the shield member 50 are arranged.

Since the connector 1 is formed by such insert-molding, the male terminal 10 and the insulation member 20 can be brought into close contact with each other, and the insulation member 20 can receive the heat of the male terminal 10. For example, since the shaft portion 22 can be arranged in close contact with the space 11c inside the terminal connection portion 11, the insulation member 20 can receive the heat of the terminal connection portion 11 which is a heat source from the inner peripheral wall of the space 11c.

In addition, since the housing 30 is also insert-molded with respect to the insulation member 20 in the connector 1, the heat dissipating portion 23 of the insulation member 20 and the fixing portion 34 of the housing 30 can be brought into close contact with each other. Accordingly, the heat can be transferred from a high-temperature side to a low-temperature side between the insulation member 20 and the housing 30 in this connector 1. For example, when the temperature of the insulation member 20 is higher than that of the housing 30, the heat dissipating portion 23 can dissipate the heat received from the shaft portion 22 to the connector installation target 100, and further, dissipate the heat even to the fixing portion 34 of the housing 30. In addition, when the temperature of the insulation member 20 is lower than that of the housing 30, the heat dissipating portion 23 not only receives heat from the shaft portion 22 but also receives heat from the fixing portion 34 of the housing 30. The heat dissipating portion 23 in this case dissipates the heat received from the shaft portion 22 and the fixing portion 34 to the connector installation target 100.

As described above, the connector 1 of the present embodiment can receive the heat of the male terminal 10 generated accompanying the energization and the heat of the housing 30 generated accompanying the heat generation of the male terminal 10 using the insulation member 20, and dissipate the received heat to the surroundings of the connector installation target 100 and the like. Therefore, the connector 1 can suppress the temperature rise of the male terminal 10, and accordingly, can suppress the temperature rise of the housing 30 and inside the housing 30. In addition, the connector 1 of the present embodiment imparts the functions of receiving and dissipating the heat to the insulation member 20 configured to achieve the electrical insulation of the distal end 11a of the terminal connection portion 11. That is, this connector 1 is not newly provided with a dedicated component configured to suppress the temperature rise accompanying the energization. In this manner, the connector 1 of the present embodiment can suppress the temperature rise while suppressing the increase in the number of components.

Here, the shield member 50 has both the electrical conductivity and the high thermal conductivity in the connector 1 as described above. Further, the shield member 50 is brought into contact with the holding member 101 (the fixed portion 101a) of the connector installation target 100 via the fixing portion 52. That is, the heat is transferred also between the shield member 50 and the connector installation target 100 in this connector 1. Thus, the heat dissipating portion 23 is also brought into contact with the shield member 50. For example, the heat dissipating portion 23 is brought into contact with a part of the shield main body 51. As a result, the heat dissipating portion 23 can transmit the heat received by itself to the shield member 50. That is, the heat dissipating portion 23 in this example can dissipate the heat received by itself to the connector installation target 100 via the shield member 50. Therefore, the connector 1 of the present embodiment further improves the heat dissipation property.

A connector according to the present embodiments can receive heat of a male terminal generated accompanying energization using an insulation member, and dissipate the received heat from a heat dissipating portion to the surroundings of a connector installation target or the like. Therefore, this connector can suppress the temperature rise of the male terminal, and accordingly, can also suppress a temperature rise of the housing and inside the housing. In addition, the connector according to the present embodiments imparts functions of receiving and dissipating the heat to the insulation member configured to achieve electrical insulation of a distal end of the terminal connection portion. That is, this connector is not newly provided with a dedicated component configured to suppress the temperature rise accompanying the energization. In this manner, the connector according to the present embodiments can suppress the temperature rise while suppressing an increase in the number of components.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A connector comprising:
a male terminal which has an outer peripheral wall side of a tubular terminal connection portion as a contact point with a mating terminal;
an insulating insulation member that achieves electrical insulation of a distal end of the terminal connection portion on a side of a mating connector; and
an insulating housing that accommodates the male terminal and the insulation member, wherein
the insulation member includes: a distal end insulation portion provided at the distal end of the terminal connection portion; a shaft portion extending from the distal end insulation portion along a space inside the terminal connection portion, and at least one heat dissipating portion which is a portion protruding from the shaft portion toward an outside of the terminal connection portion in a direction intersecting a cylinder axis of the terminal connection portion, and is capable of dissipating heat at the outside of the terminal connection portion.

2. The connector according to claim 1, further comprising:
a shield member which has both an electrical conductivity and a high thermal conductivity, electrically shields an inside of the housing, and is brought into contact with the connector installation target, wherein
the heat dissipating portion is brought into contact with the shield member.

3. The connector according to claim 1, wherein
the housing has a fixing portion which is attached to a connector installation target, and
the heat dissipating portion is brought into contact with the connector installation target when the housing is attached to the connector installation target.

4. The connector according to claim 3, further comprising:
a shield member which has both an electrical conductivity and a high thermal conductivity, electrically shields an inside of the housing, and is brought into contact with the connector installation target, wherein
the heat dissipating portion is brought into contact with the shield member.

5. The connector according to claim 3, wherein
the heat dissipating portion is brought into contact with a portion of the connector installation target having a higher thermal conductivity than that of the insulation member.

6. The connector according to claim 5, further comprising:
a shield member which has both an electrical conductivity and a high thermal conductivity, electrically shields an inside of the housing, and is brought into contact with the connector installation target, wherein
the heat dissipating portion is brought into contact with the shield member.

7. The connector according to claim 3, wherein
the heat dissipating portion is sandwiched between the housing and the connector installation target when the housing is attached to the connector installation target.

8. The connector according to claim 7, wherein
the heat dissipating portion is brought into contact with a portion of the connector installation target having a higher thermal conductivity than that of the insulation member.

9. The connector according to claim 7, further comprising:
a shield member which has both an electrical conductivity and a high thermal conductivity, electrically shields an inside of the housing, and is brought into contact with the connector installation target, wherein
the heat dissipating portion is brought into contact with the shield member.

* * * * *